United States Patent
Ye

(10) Patent No.: US 11,121,331 B2
(45) Date of Patent: Sep. 14, 2021

(54) FLEXIBLE SUBSTRATE AND DISPLAY PANEL USING THE SAME

(71) Applicant: Wuhan China Star Optoelectronics Semiconductor Display Technology Co., Ltd., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 272 days.

(21) Appl. No.: 16/344,357

(22) PCT Filed: Dec. 25, 2018

(86) PCT No.: PCT/CN2018/123304
§ 371 (c)(1),
(2) Date: Apr. 23, 2019

(87) PCT Pub. No.: WO2020/113705
PCT Pub. Date: Jun. 11, 2020

(65) Prior Publication Data
US 2021/0005829 A1  Jan. 7, 2021

(30) Foreign Application Priority Data
Dec. 4, 2018 (CN) .......................... 201811472439.9

(51) Int. Cl.
*H01L 51/00* (2006.01)
*G02F 1/1333* (2006.01)
(Continued)

(52) U.S. Cl.
CPC .... *H01L 51/0097* (2013.01); *G02F 1/133305* (2013.01); *G02F 1/133514* (2013.01); *H01L 27/3276* (2013.01)

(58) Field of Classification Search
CPC ............. H01L 27/3276; H01L 51/0097; G02F 1/133305; G02F 1/133514; G02F 1/13452
See application file for complete search history.

(56) References Cited

U.S. PATENT DOCUMENTS 5,168,384 A * 12/1992 Genba ................. G02F 1/13452
349/58
10,520,978 B1   12/2019 Li et al.
(Continued)

FOREIGN PATENT DOCUMENTS

CN    205428453 U    8/2016
CN    107995988 A    5/2018
(Continued)

*Primary Examiner* — Hoan C Nguyen
(74) *Attorney, Agent, or Firm* — Hamre, Schumann, Mueller & Larson, P.C.

(57) ABSTRACT

A flexible substrate and a display panel using the same are provided. A plurality of groups of solder pads are provided. Each group of the solder pads is connected to each bending region. That is, the plurality of the groups of solder pads are distributed on a plurality of independent bending regions. It can be avoided that all groups of solder pads mentioned in the prior art are gathered from a lower frame of the display panel to an intermediate region to form an integral trace. Therefore, an area of a non-display region is greatly reduced, and a screen ratio is improved.

20 Claims, 4 Drawing Sheets

(51) Int. Cl.
  *G02F 1/1335* (2006.01)
  *H01L 27/32* (2006.01)

(56) References Cited

U.S. PATENT DOCUMENTS

| | | | |
|---|---|---|---|
| 2005/0062898 A1 * | 3/2005 | Imayama | G02F 1/133345 |
| | | | 349/43 |
| 2017/0168463 A1 * | 6/2017 | Hong | G04G 9/0064 |
| 2017/0351019 A1 * | 12/2017 | Kadowaki | G02B 6/0088 |
| 2018/0024395 A1 * | 1/2018 | Mitani | G02F 1/13454 |
| | | | 349/150 |
| 2018/0108292 A1 | 4/2018 | Xu | |
| 2020/0029437 A1 * | 1/2020 | Jin | H05K 1/028 |

FOREIGN PATENT DOCUMENTS

| | | | |
|---|---|---|---|
| CN | 108766249 A | 11/2018 | |
| CN | 108807476 A | 11/2018 | |
| JP | 10065303 A * | 3/1998 | H01R 12/62 |

\* cited by examiner

FLEXIBLE SUBSTRATE AND DISPLAY PANEL USING THE SAME

BACKGROUND OF INVENTION

Field of Invention

The present invention relates to a field of display devices, and more particularly to a flexible substrate and a display panel using the same.

Description of Prior Art

Currently, full-screen mobile phones are popular, and screens with a high ratio screen are becoming more and more popular. A screen ratio is referred to a ratio of a screen area to a whole mobile phone area. Users have a better visual experience with a high screen ratio. Due to the high screen ratio, full screen display devices have a good display effect. Therefore, the full screen display devices are more and more popular among customers and have become an inevitable trend in the future of development of electronic devices, such as mobile phones.

Active-matrix organic light emitting diode (AMOLED) display panels are widely used display panels. A background of the prior art of the present invention is described below with the AMOLED display panels as an example. Of course, the background technology of the present invention is not limited thereto. FIG. 1 is a schematic view of a structure of a conventional flexible AMOLED display panel. Referring to FIG. 1, the AMOLED display panel comprises a display region A and a non-display region B, and the non-display region B constitutes a frame of the display region A. For example, the non-display region B forms a frame below the display region A. A plurality of solder pads (fan-out traces) 10 are usually disposed in the non-display region B, for example, the solder pads 10 are disposed within a lower frame. The solder pads 10 are typically formed at an end of a power line, scan line, and data line 11 of the AMOLED display panel. The power line, the scan line, and the data line 11 are electrically connected to a driving circuit unit 13 through the solder pads 10. The power line comprises, but not limited to, a power supply voltage (VDD) signal line 12 and a constant voltage low-level source (VSS) signal line 14.

The solder pads 10 are disposed in the non-display region B, that is, in the frame of the AMOLED display panel. A larger area of the solder pads 10 results a larger frame of the AMOLED display panel. When an area of frame of the AMOLED display panel is increased, the screen ratio is decreased. Correspondingly, when the size of the whole mobile phone is constant, an area of the display region is reduced.

Currently, the flexible AMOLED display panels generally adopt a pad-bending process. The solder pads 10 disposed in the non-display region B are bent to a back side of the AMOLED display panel. The solder pads 10 are electrically connected to the driving circuit unit 13 at the back side of the flexible AMOLED display panel, thereby a size of the display frame is reduced.

Now, the bending process for the flexible AMOLED display panel is one stage pad-bending. The solder pads 10 are gathered from the lower frame of the display panel to an intermediate region to form an integral trace and then are bent integrally to the back side of the flexible AMOLED display panel. Although this can reduce the width of the frame of the flexible AMOLED display panel, it does not meet the current needs.

SUMMARY OF INVENTION

The present invention provides a flexible substrate and a display panel using the same to solve the problems in the prior art. It can reduce the width of the frame of the display panel and improve a screen ratio.

In order to solve the problems, one embodiment of the present invention provides a flexible substrate comprising: a display region; a first bending region, a second bending region, and a third bending region being independent of each other, wherein the first bending region, the second bending region, and the third bending region are bent to a back side of the flexible substrate, the first bending region, the second bending region, and the third bending region are disposed at a first edge of the display region, the first bending region and the third bending region are respectively disposed at two sides of the second bending region, the first bending region and the second bending region form an acute included angle, the third bending region and the second bending region form an acute included angle, the first edge of the display region has two symmetrical corner regions and an intermediate region is disposed between the two corner regions, the first bending region and the third region are respectively disposed at the corner regions, and the second bending region is disposed in the intermediate region; and a first group of solder pads, a second group of solder pads, and a third group of solder pads, wherein the first group of solder pads is disposed in the first bending region, the second group of solder pads is disposed in the second bending region, the third group of solder pads is disposed in the third bending region, and one end of each of the first group, the second group, and the third group of solder pads is electrically connected to traces of a functional layer disposed in the display region and the other end thereof is electrically connected to a driving circuit unit.

In one embodiment of the present invention, the first bending region and the third bending region are symmetrically disposed with respect to the second bending region which acts as an axis of symmetry.

In one embodiment of the present invention, the first group of solder pads is electrically connected to a first power line disposed in the display region, the second group of solder pads is electrically connected to a first metal trace disposed in the display region, and the third group of solder pads is electrically connected to a second power line disposed in the display region.

In one embodiment of the present invention, the first group of solder pads is electrically connected to a first power line and a first metal trace disposed in the display region, the second group of solder pads is electrically connected to a second metal trace disposed in the display region, and the third group of solder pads is electrically connected to a second power line and a third metal trace disposed in the display region.

In order to solve the problems, another embodiment of the present invention provides a flexible substrate comprising: a display region; a plurality of bending regions, wherein each of the plurality of bending regions is independent of each other and disposed at an edge of the display region, and each of the plurality of bending regions is bent to a back side of the flexible substrate; and a plurality of group of solder pads, wherein each of the plurality of group of solder pads is respectively disposed in the corresponding bending regions, and one end of each of the plurality of group of solder pads is electrically connected to traces of a functional layer disposed in the display region and the other end thereof is electrically connected to a driving circuit unit.

In one embodiment of the present invention, the flexible substrate comprises a first bending region, a second bending region, and a third bending region, the first bending region, the second bending region, and the third bending region are disposed at a first edge of the display region, the first bending region and the third bending region are respectively disposed at two sides of the second bending region, the first bending region and the second bending region form an acute included angle, and the third bending region and the second bending region form an acute included angle.

In one embodiment of the present invention, the first bending region and the third bending region are symmetrically disposed with respect to the second bending region which acts as an axis of symmetry.

In one embodiment of the present invention, the first edge of the display region has two symmetrical corner regions and an intermediate region is disposed between the two corner regions, the first bending region and the third region are respectively disposed at the corner regions, and the second bending region is disposed in the intermediate region.

In one embodiment of the present invention, the flexible substrate comprises a first group of solder pads, a second group of solder pads, and a third group of solder pads, wherein the first group of solder pads is disposed in the first bending region, the second group of solder pads is disposed in the second bending region, the third group of solder pads is disposed in the third bending region.

In one embodiment of the present invention, the first group of solder pads is electrically connected to a first power line disposed in the display region, the second group of solder pads is electrically connected to a first metal trace disposed in the display region, and the third group of solder pads is electrically connected to a second power line disposed in the display region.

In one embodiment of the present invention, the first group of solder pads is connected to a first power line and a first metal trace disposed in the display region, the second group of solder pads is electrically connected to a second metal trace disposed in the display region, and the third group of solder pads is connected to a second power line and a third metal trace disposed in the display region.

Furthermore, another embodiment of the present invention provides a display panel, comprising a flexible substrate as described above and a display device layer, and the display device layer is disposed on the flexible substrate and corresponds the display region, and the bending region is bent to one side of the flexible substrate facing away the display device layer.

In one embodiment of the present invention, the display device layer comprises an organic light-emitting layer and a packaging layer, and the organic light-emitting layer is disposed between the packing layer and the flexible substrate.

In one embodiment of the present invention, the display device layer comprises a liquid crystal layer and a color film substrate, and the liquid crystal layer is disposed between the color film substrate and the flexible substrate.

In one embodiment of the present invention, the flexible substrate comprises a first bending region, a second bending region, and a third bending region, the first bending region, the second bending region, and the third bending region are disposed at a first edge of the display region, the first bending region and the third bending region are respectively disposed at two sides of the second bending region, the first bending region and the second bending region form an acute included angle, and the third bending region and the second bending region form an acute included angle.

In one embodiment of the present invention, the first bending region and the third bending region are symmetrically disposed with respect to the second bending region which acts as an axis of symmetry.

In one embodiment of the present invention, the first edge of the display region has two symmetrical corner regions and an intermediate region is disposed between the two corner regions, the first bending region and the third region are respectively disposed at the corner regions, and the second bending region is disposed in the intermediate region.

In one embodiment of the present invention, the flexible substrate comprises a first group of solder pads, a second group of solder pads, and a third group of solder pads, wherein the first group of solder pads is disposed in the first bending region, the second group of solder pads is disposed in the second bending region, the third group of solder pads is disposed in the third bending region.

In one embodiment of the present invention, the first group of solder pads is electrically connected to a first power line disposed in the display region, the second group of solder pads is electrically connected to a first metal trace disposed in the display region, and the third group of solder pads is electrically connected to a second power line disposed in the display region.

In one embodiment of the present invention, the first group of solder pads is connected to a first power line and a first metal trace disposed in the display region, the second group of solder pads is electrically connected to a second metal trace disposed in the display region, and the third group of solder pads is connected to a second power line and a third metal trace disposed in the display region.

The present invention has beneficial effects as described below. A plurality of group of solder pads are provided. Each group of solder pads is connected to each bending region. That is, a plurality of group of solder pads is distributed on a plurality of independent bending regions. It can be avoided that all groups of solder pads mentioned in the prior art are gathered from a lower frame of display panel to an intermediate region to form an integral trace. Therefore, an area of the non-display region is greatly reduced, and the screen ratio is improved.

DETAILED DESCRIPTION OF PREFERRED EMBODIMENTS

A flexible substrate and a display panel using the same provided by one embodiment of the present invention are described in detail below with reference to the accompanying drawings.

Figure 2:
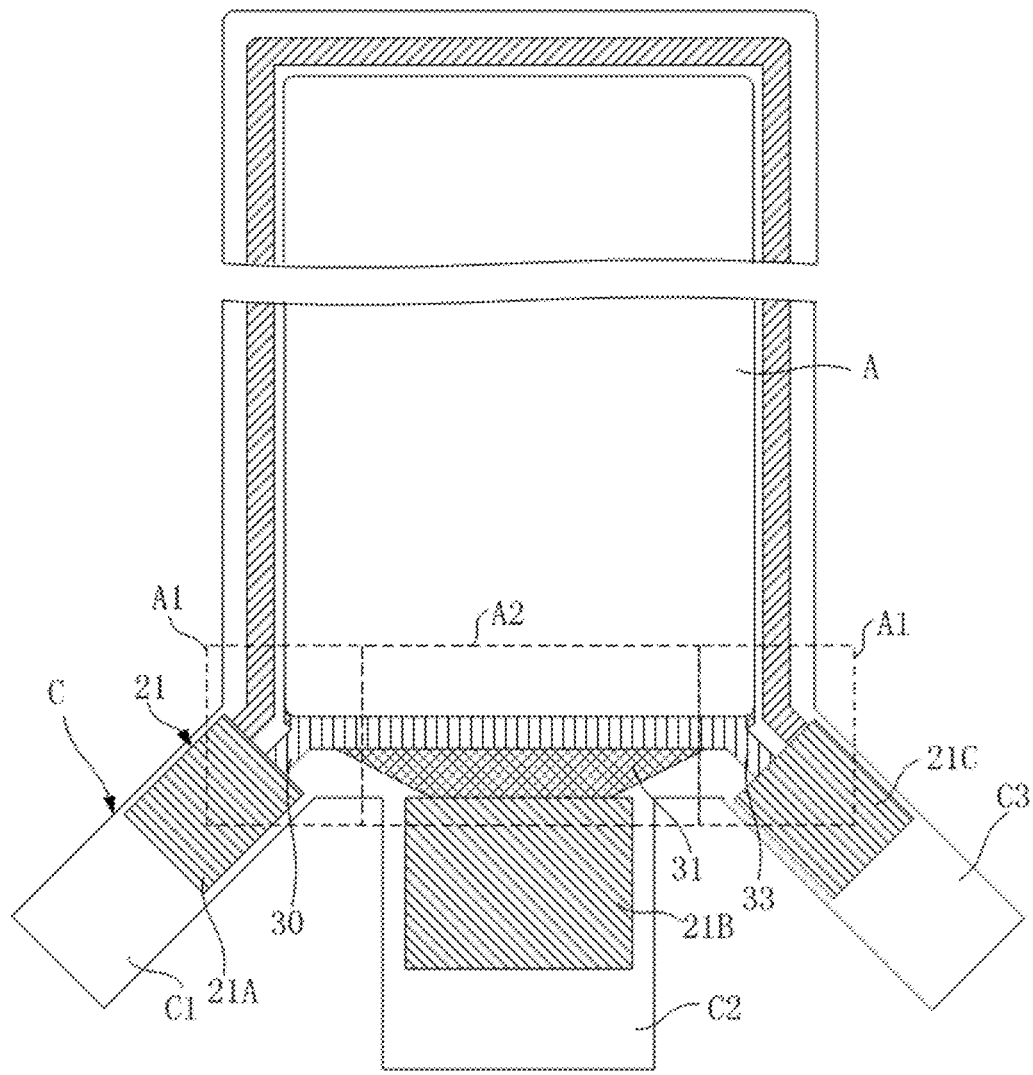
FIG. 2 is a schematic view of a non-bent flexible substrate structure according to one embodiment of the present invention.

Referring to FIG. 2, it is a schematic view of a non-bent flexible substrate structure according to one embodiment of the present invention. The flexible substrate 20 according to one embodiment of the present invention comprises a display region A, a plurality of bending regions C which are independent of each other, and a plurality of groups of solder pads 21. The plurality of bending regions C are disposed in a non-display region of the flexible substrate 20. In the embodiment, the flexible substrate 20 comprises three bending regions C. For the convenience of description, the three bending regions C are defined as a first bending region C1, a second bending region C2, and a third bending region C3.

The flexible substrate 20 can be a flexible array substrate. Specifically, the flexible substrate 20 is made of a flexible base 201 and a plurality of functional layers 202 disposed on the flexible base 201. The flexible substrate 20 comprises, but is not limited to, polyimide. The functional layer 202 can be disposed in the display region A and the bending regions according to the requirements of the flexible substrate 20. The functional layer 202 comprises, but not limited to, a thin film transistor layer. Both of the flexible substrate and the functional layer are conventional structures and are not described herein below.

The bending regions C are disposed at an edge of the display region A. Specifically, the bending regions C are connected to the edge of the display region A. For example, the bending regions C can be disposed at an upper edge, a lower edge, a left edge, or a right edge of the display region A. Of course, the bending regions C can be disposed at the same edge of the display region A, or can be disposed at different edges. In the embodiment of the present invention, the first bending region C1, the second bending region C2, and the third bending region C3 are disposed on the same edge of the display region A, such as the lower edge.

The bending regions C can be bent to a back side of the flexible substrate 20. The back side of the flexible substrate 20 is referred to the side of the flexible substrate 20 provided without a functional layer. Specifically, the bending regions C can be bent under an external force, and end portions of the bending portions C can be bent to the back side of the display region A of the flexible substrate 20. An advantage of the bending regions C being bent to the back side of the flexible substrate 20 is that a width of the non-display region of the flexible substrate 20 is reduced and the display region A of the flexible substrate 20 is increased, and a screen ratio between the display region A and the non-display region is improved. Since the bending regions C are independent of each other, each of the bending regions C does not affect each other when each of the bending regions C is bent.

Each group of solder pads 21 is consisted of at least one pad. Each group of solder pads 21 is disposed in the corresponding bending region C, and more specifically, one of the groups of solder pad 21 is disposed in one bending region C. That is, each of the bending regions C is provided with one of the groups of solder pads. For example, in the embodiment of the present invention, the flexible substrate 20 comprises three of the groups of solder pads 21, which are respectively defined as a first group of solder pads 21A, a second group of solder pads 21B, and a third group of solder pads 21C. The first group of solder pads 21A is disposed in the first bending region C1, the second group of solder pads 21B is disposed in the second bending region C2, the third group of solder pads 21C is disposed in the third bending region C3. One end of each group of solder pads 21 is connected to traces disposed in a functional layer of the display region A, and the traces disposed in the functional layer comprises, but are not limited to, a power line and a metal trace. The metal trace is referred to a data line and a scan line of the flexible substrate. The other end of each group of solder pads 21 is connected to at least one driving circuit unit 22 (shown in FIG. 4 and FIG. 5). Specifically, the other end of each group of solder pads 21 is connected to the same driving circuit unit 22, or the other end of each group of solder pads 21 is respectively connected to a plurality of the driving circuit units 22. In the embodiment of the present invention, the other ends of the plurality of the groups of solder pads 21 are connected to the same driving circuit unit 22.

Figure 1:
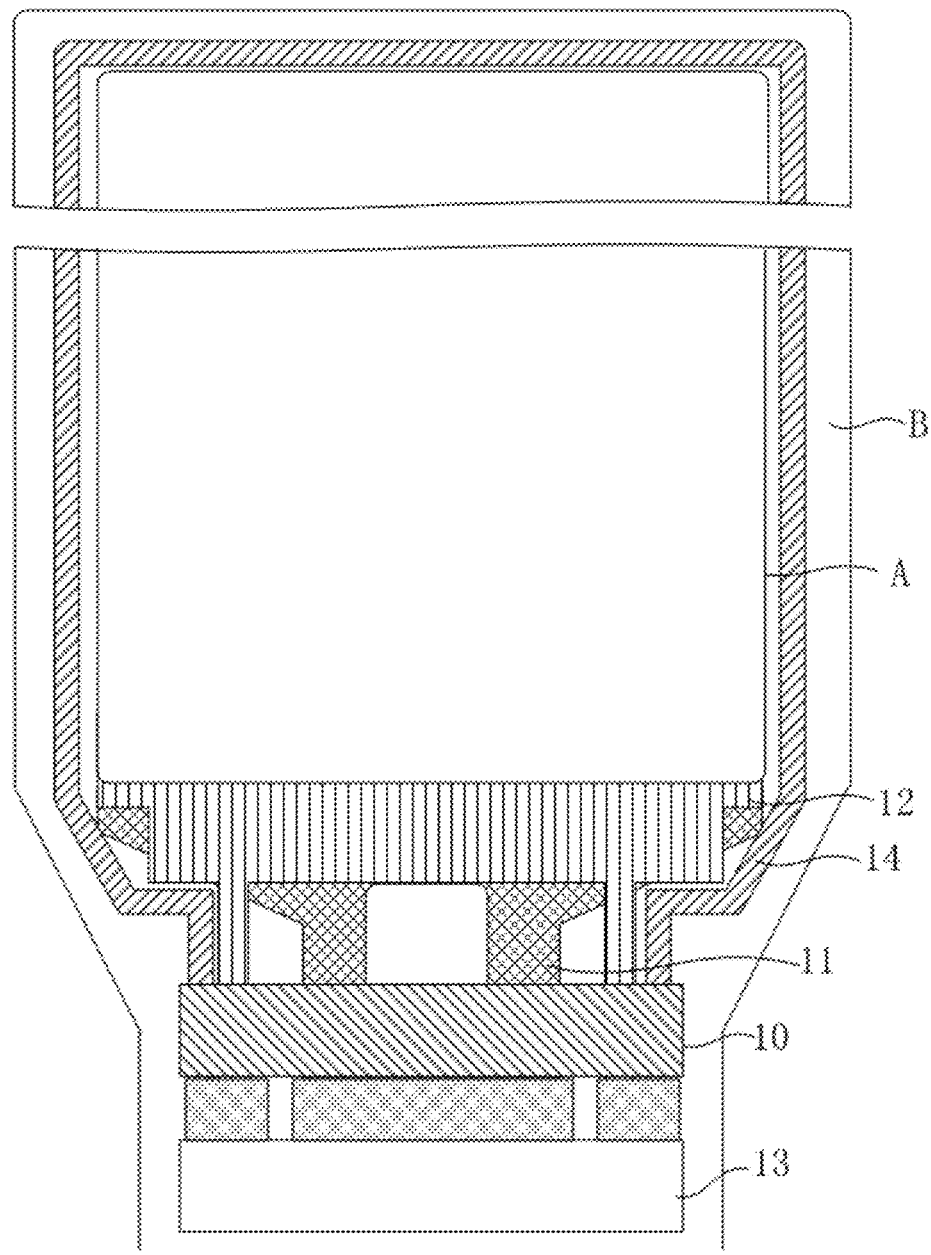
FIG. 1 is a schematic view of a structure of a conventional flexible active-matrix organic light emitting diode (AMOLED) display panel.

The flexible substrate according one embodiment of the present invention divides the solder pads into a plurality of groups of solder pads, and each of the group of solder pads 21 is connected to a bending region. That is, the plurality of the groups of solder pads is distributed on a plurality of independent bending regions C. It can be avoided that all groups of the solder pads 10 mentioned in the prior art (see FIG. 1) are gathered from a lower frame of the display panel to an intermediate region to form an integral trace. Therefore, an area of the non-display region is greatly reduced, and the screen ratio is improved.

In one embodiment of the present invention, the first bending region C1, the second bending region C2, and the third bending region C3 are disposed at a first edge of the display region A. The first edge is a lower edge of the display region A. When the flexible substrate 20 is formed into a flexible display panel, the first bending region C1, the first bending region C2, and the third bending region C3 are bent to form a non-display region, and the non-display region is a lower frame of the flexible display panel. The first bending region C1 and the third bending region C3 are respectively disposed at two sides of the second bending region C2. The first bending region C1 and the second bending region C2 form an acute included angle, and the third bending region C3 and the second bending region C2 form an acute included angle. That is, the first bending region C1 and the second bending region C2, and the third bending region C3 and the second bending region C2 are not parallel. The first bending region C1, the second bending region C2, and the third bending region C3 extend in a diverging way from the first edge of the display region A.

The first bending region C1 and the third bending region C3 are symmetrically disposed with respect to the second bending region C2 which acts as an axis of symmetry. Furthermore, in one embodiment of the present invention, the first edge of the display region A has two corner regions A1 which are symmetrically disposed (shown by a broken line frame in FIG. 2). An intermediate region A2 is disposed between the two corner regions A1. The first bending region C1 and the third bending region C3 are respectively disposed in the two corner regions A1, and the second bending region C2 is disposed between the intermediate region A2. The advantage is that the two bending regions respectively disposed in the two corner regions A1 can further reduce the area of the non-display region, so that the screen ratio is improved.

In one embodiment of the present invention, the first group of solder pads 21 is electrically connected to a first power line 30 disposed in the display region A. Specifically, the first power line 30 is referred to a power line disposed in a left side of the display region A, and the first power line 30 comprises, but not limited to, a power supply voltage (VDD) signal line and a constant voltage low-level source (VSS) signal line. The second group of solder pads 21B is electrically connected to a metal trace 31 disposed in the display region A. The specific structure of the metal trace 31 is not shown in the drawing and it is merely indicated by a region. The metal trace 31 comprises a data line and a scan line disposed in the flexible substrate 20. That is, all the metal traces 31 disposed in the flexible substrate 20 are electrically connected to the solder pads disposed in the same bending region. The third group of solder pads 21C is electrically connected to a second power line 33 disposed in the display region A. Specifically, the second power line 33 is referred to a power line disposed at a right side of the display region A, and the second power line 33 comprises, but not limited to, a power supply voltage (VDD) signal line and a constant voltage low-level source (VSS) signal line.

Figure 3:
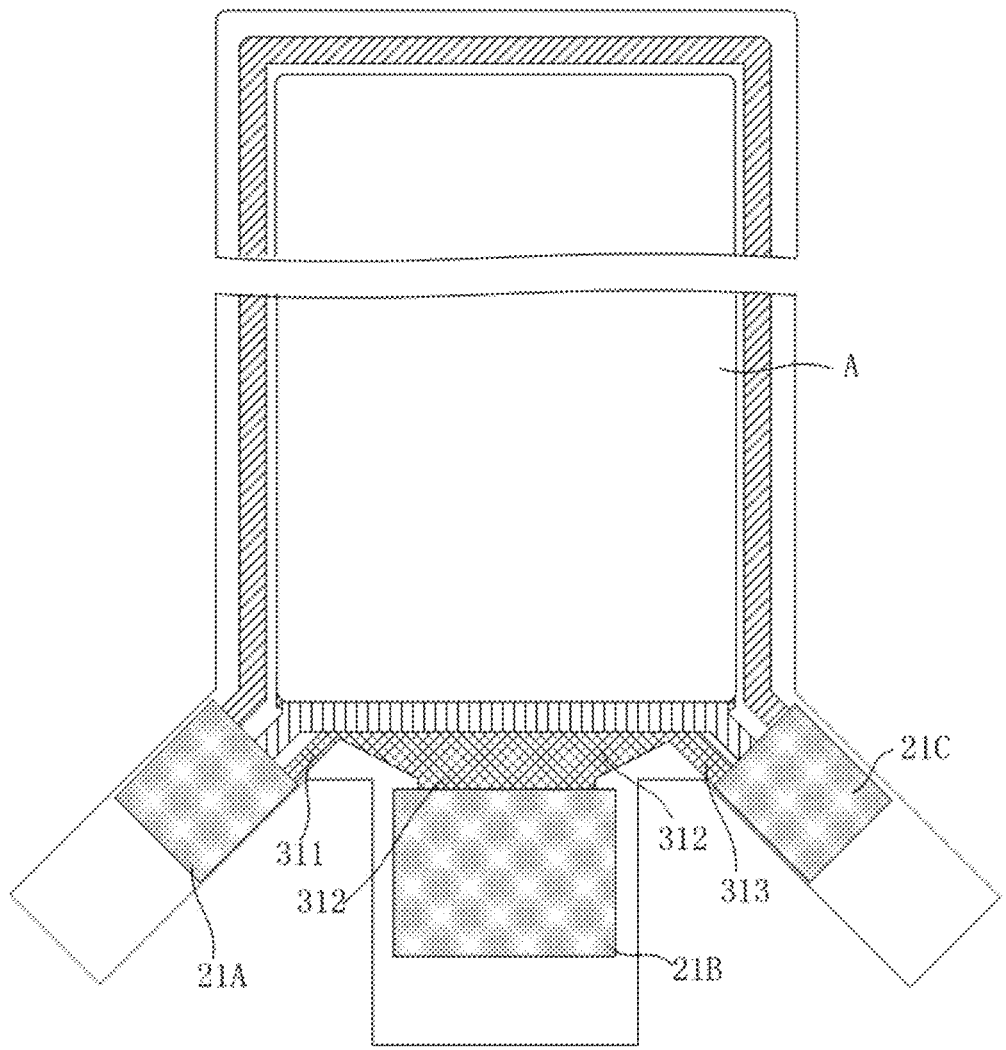
FIG. 3 is a schematic view of a flexible substrate structure according to another embodiment of the present invention.

A manner of a function trace connection between the group of solder pads and the display region A is not limited to above-mentioned embodiments of the present invention. For example, FIG. 3 is a schematic view of a flexible substrate structure according to another embodiment of the present invention. Referring to FIG. 3, the first group of solder pads 21A is electrically connected to the first power line 30 disposed in the display region A and a first metal trace 311. The first metal trace 311 is referred to a power line disposed at the left side of the display region A. The first metal trace 311 comprises, but not limited to, a power supply voltage (VDD) signal line and a constant voltage low-level source (VSS) signal line. The second group of solder pads 21B is electrically connected to a second metal trace 312 disposed in the display region A. The third group of solder pads 21C is electrically connected to the second power line 33 and a third metal trace 313 disposed in the display region A. The second power line 33 is referred to the power line disposed at the right side of the display region A, and the second power line 33 comprises, but not limited to, a power supply voltage (VDD) signal line and a constant voltage low-level source (VSS) signal line. In the embodiment of present invention, it can be seen that the metal trace of the flexible substrate 20 is divided into three parts, which are respectively connected to the group of solder pads 21 disposed in the three bending regions.

Figure 4:
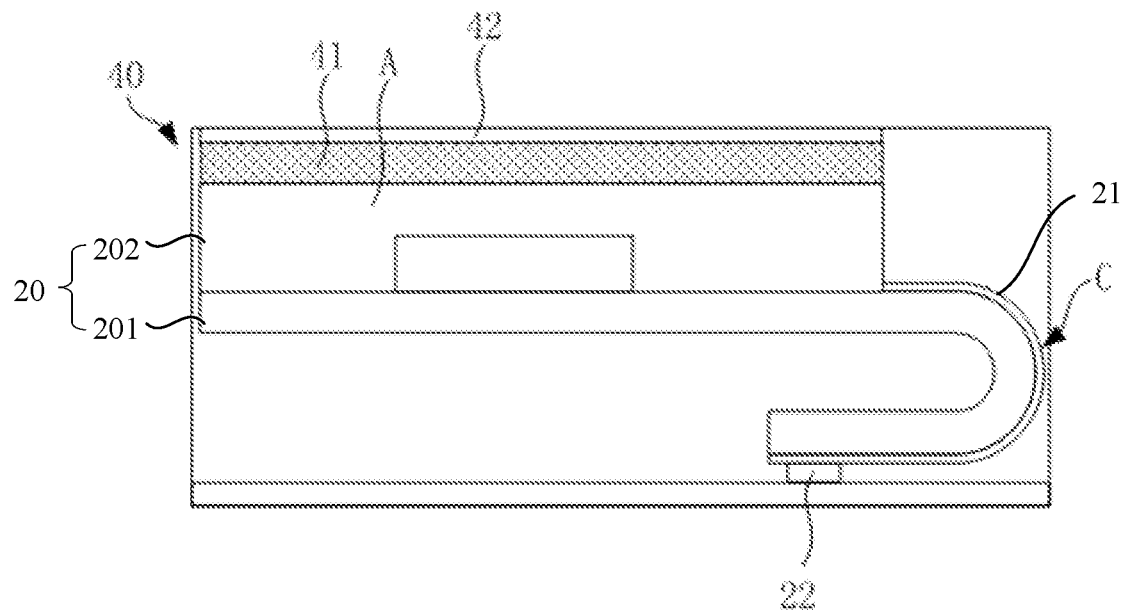
FIG. 4 is a schematic view of a display panel structure according to one embodiment of the present invention.

According to one embodiment of the present invention, a display panel using the above-mentioned flexible substrate is provided. FIG. 4 is a schematic view of a display panel structure according to one embodiment of the present invention. Referring to FIG. 4, the display panel comprises the flexible substrate 20 and a display device layer 40 as described above. The display device layer 40 is disposed on the flexible substrate and corresponds to the display region A. The bending region C is bent to one side of the flexible substrate 20 facing away the display device layer 40. In the embodiment. In the embodiment of the present invention, a width of the frame of the display panel is greatly reduced as compared to the prior art, and the screen ratio of the display panel is improved. Further, in the embodiment of the present invention, the display device layer 40 comprises an organic light emitting layer 41 and a packaging layer 42. The organic light emitting layer 41 is disposed between the packaging layer 42 and the flexible substrate 20. Specifically, in the embodiment of the present invention, the display panel is an organic light emitting diode (OLED) display panel, which can further comprise other structural layers as known in the art. The organic light emitting layer 41 and the packaging layer 42 are conventional structural layers of an OLED display panel and not described herein below.

Figure 5:
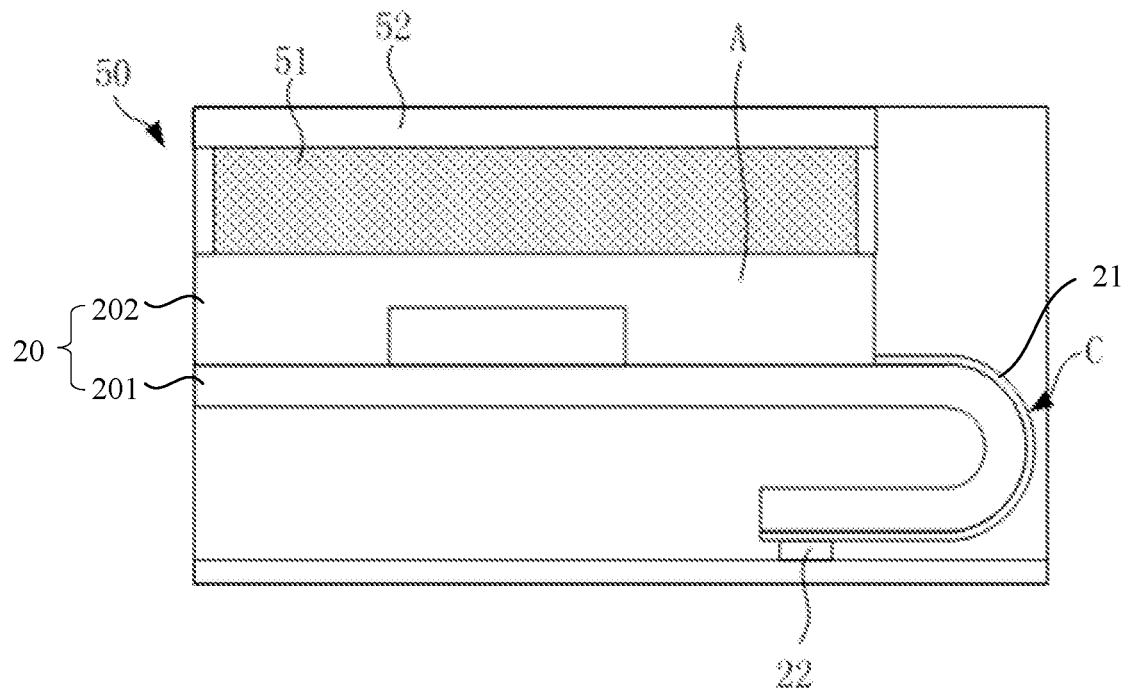
FIG. 5 is a schematic view of a display panel structure according to another embodiment of the present invention.

FIG. 5 is a schematic view of a display panel structure according to one embodiment of the present invention. Referring to FIG. 5, the display panel comprises the flexible substrate 20 and the display device layer 50 as described above. The display device layer 50 is disposed on the flexible substrate 20 and corresponds to the display region A. The bending region C is bent to one side of the flexible substrate 20 facing away the display device layer 50. In the embodiment of the present invention, a width of the frame of the display panel is greatly reduced as compared to the prior art, and the screen ratio of the display panel is improved. Further, in the embodiment of the present invention, the display device layer 50 comprises a liquid crystal layer 51 and a color film substrate 52. The liquid crystal layer 51 is disposed between the color film substrate 52 and the flexible substrate 20. Specifically, in the embodiment of the present invention, the display panel is a liquid crystal display panel, which can further comprise other structural layers as known in the art. The liquid crystal layer 51 and the color films substrate 52 are conventional structures of a liquid crystal display panel and not described herein below.

According to the embodiment of the present invention, the plurality of the groups of solder pads are distributed on the plurality of the independent bending regions. It can be avoided that all groups of solder pads mentioned in the prior art are gathered from a lower frame of a display panel to an intermediate region to form an integral trace. Therefore, an area of the non-display region is greatly reduced, and the screen ratio is improved.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:
1. A flexible substrate, comprising:
 a flexible base comprising a display region, a first bending region, a second bending region, and a third bending region being independent of each other, wherein the flexible base is bent such that the first bending region, the second bending region, and the third bending region are bent to a back side of the flexible substrate, the first bending region, the second bending region, and the third bending region are disposed at a first edge of the display region, the first bending region and the third bending region are respectively disposed at two sides of the second bending region, the first bending region and the second bending region form an acute included angle, the third bending region and the second bending region form an acute included angle, the first edge of the display region has two symmetrical corner regions and an intermediate region is disposed between the two corner regions, the first bending region and the third region are respectively disposed at the corner regions, and the second bending region is disposed in the intermediate region;
 a functional layer disposed on the flexible base; and
 a first group of solder pads disposed on the flexible base, a second group of solder pads disposed on the flexible base, and a third group of solder pads disposed on the flexible base, wherein the first group of solder pads is disposed in the first bending region, the second group of solder pads is disposed in the second bending region, the third group of solder pads is disposed in the third bending region, and wherein the first group of solder pads, the second group of solder pads, and the third group of solder pads are bent together with the flexible base such that one end of each of the first group, the second group, and the third group of solder pads is electrically connected to traces of the functional layer disposed in the display region and the other end thereof is electrically connected to a driving circuit unit.

2. The flexible substrate according to claim 1, wherein the first bending region and the third bending region are symmetrically disposed with respect to the second bending region which acts as an axis of symmetry.

3. The flexible substrate according to claim 1, wherein the first group of solder pads is electrically connected to a first power line disposed in the display region, the second group of solder pads is electrically connected to a first metal trace disposed in the display region, and the third group of solder pads is electrically connected to a second power line disposed in the display region.

4. The flexible substrate according to claim 1, wherein the first group of solder pads is electrically connected to a first power line and a first metal trace disposed in the display region, the second group of solder pads is electrically connected to a second metal trace disposed in the display region, and the third group of solder pads is electrically connected to a second power line and a third metal trace disposed in the display region.

5. A flexible substrate, comprising:
a flexible base comprising a display region and a plurality of bending regions, wherein each of the plurality of bending regions is independent of each other and disposed at an edge of the display region, and the flexible base is bent such that each of the plurality of bending regions is bent to a back side of the flexible substrate;
a functional layer disposed on the flexible base; and
a plurality of groups of solder pads disposed on the flexible base, wherein each of the plurality of the groups of solder pads is respectively disposed in the corresponding bending regions, and wherein the plurality of groups of solder pads are bent together with the flexible base such that one end of each of the plurality of the groups of solder pads is electrically connected to traces of the functional layer disposed in the display region and the other end thereof is electrically connected to a driving circuit unit.

6. The flexible substrate according to claim 5, wherein the flexible substrate comprises a first bending region, a second bending region, and a third bending region, the first bending region, the second bending region, and the third bending region are disposed at a first edge of the display region, the first bending region and the third bending region are respectively disposed at two sides of the second bending region, the first bending region and the second bending region form an acute included angle, and the third bending region and the second bending region form an acute included angle.

7. The flexible substrate according to claim 6, wherein the first bending region and the third bending region are symmetrically disposed with respect to the second bending region which acts as an axis of symmetry.

8. The flexible substrate according to claim 6, wherein the first edge of the display region has two symmetrical corner regions and an intermediate region is disposed between the two corner regions, the first bending region and the third bending region are respectively disposed at the corner regions, and the second bending region is disposed in the intermediate region.

9. The flexible substrate according to claim 6, wherein the flexible substrate comprises a first group of solder pads, a second group of solder pads, and a third group of solder pads, wherein the first group of solder pads is disposed in the first bending region, the second group of solder pads is disposed in the second bending region, and the third group of solder pads is disposed in the third bending region.

10. The flexible substrate according to claim 9, wherein the first group of solder pads is electrically connected to a first power line disposed in the display region, the second group of solder pads is electrically connected to a first metal trace disposed in the display region, and the third group of solder pads is electrically connected to a second power line disposed in the display region.

11. The flexible substrate according to claim 9, wherein the first group of solder pads is connected to a first power line and a first metal trace disposed in the display region, the second group of solder pads is electrically connected to a second metal trace disposed in the display region, and the third group of solder pads is connected to a second power line and a third metal trace disposed in the display region.

12. A display panel, comprising the flexible substrate of claim 5 and a display device layer, wherein the display device layer is disposed on the flexible substrate and corresponds a display region, and a bending region is bent to one side of the flexible substrate facing away the display device layer.

13. The display panel according to claim 12, wherein the display device layer comprises an organic light-emitting layer and a packaging layer, and the organic light-emitting layer is disposed between the packing layer and the flexible substrate.

14. The display panel according to claim 12, wherein the display device layer comprises a liquid crystal layer and a color film substrate, and the liquid crystal layer is disposed between the color film substrate and the flexible substrate.

15. The display panel according to claim 12, wherein the flexible substrate comprises a first bending region, a second bending region, and a third bending region, the first bending region, the second bending region, and the third bending region are disposed at a first edge of the display region, the first bending region and the third bending region are respectively disposed at two sides of the second bending region, the first bending region and the second bending region form an acute included angle, and the third bending region and the second bending region form an acute included angle.

16. The display panel according to claim 12, wherein the first bending region and the third bending region are symmetrically disposed with respect to the second bending region which acts as an axis of symmetry.

17. The display panel according to claim 12, wherein the first edge of the display region has two symmetrical corner regions and an intermediate region is disposed between the two corner regions, the first bending region and the third region are respectively disposed at the corner regions, and the second bending region is disposed in the intermediate region.

18. The display panel according to claim 12, wherein the flexible substrate comprises a first group of solder pads, a second group of solder pads, and a third group of solder pads, wherein the first group of solder pads is disposed in the first bending region, the second group of solder pads is disposed in the second bending region, and the third group of solder pads is disposed in the third bending region.

19. The display panel according to claim 18, wherein the first group of solder pads is electrically connected to a first power line disposed in the display region, the second group of solder pads is electrically connected to a first metal trace disposed in the display region, and the third group of solder pads is electrically connected to a second power line disposed in the display region.

20. The display panel according to claim 18, wherein the first group of solder pads is connected to a first power line and a first metal trace disposed in the display region, the second group of solder pads is electrically connected to a second metal trace disposed in the display region, and the third group of solder pads is connected to a second power line and a third metal trace disposed in the display region.

\* \* \* \* \*